(12) United States Patent
Henderkott et al.

(10) Patent No.: US 11,612,947 B2
(45) Date of Patent: Mar. 28, 2023

(54) METHOD OF DIFFUSION BONDING UTILIZING VAPOR DEPOSITION

(71) Applicant: Rolls-Royce Corporation, Indianapolis, IN (US)

(72) Inventors: Joseph P. Henderkott, Westfield, IN (US); Timothy Fuesting, Thorntown, IN (US)

(73) Assignee: ROLLS-ROYCE CORPORATION, Indianapolis, IN (US)

( * ) Notice: Subject to any disclaimer, the term of this patent is extended or adjusted under 35 U.S.C. 154(b) by 450 days.

(21) Appl. No.: 16/734,577

(22) Filed: Jan. 6, 2020

(65) Prior Publication Data

US 2021/0205911 A1 Jul. 8, 2021

(51) Int. Cl.
| | |
|---|---|
| *B23K 1/00* | (2006.01) |
| *B23K 1/015* | (2006.01) |
| *C23C 14/34* | (2006.01) |
| *C23C 14/24* | (2006.01) |
| *B23K 103/08* | (2006.01) |
| *B23K 101/00* | (2006.01) |

(52) U.S. Cl.
CPC .............. *B23K 1/015* (2013.01); *C23C 14/24* (2013.01); *C23C 14/34* (2013.01); *B23K 2101/001* (2018.08); *B23K 2103/08* (2018.08)

(58) Field of Classification Search
CPC ........ B23K 35/30; B23K 1/0018; B23K 1/19; B23K 1/20; B23K 20/026; B23K 20/16; B23K 2101/001; B23K 2103/26; B23K 26/34; B23K 26/382; B23K 31/02; B23K 35/001; B23K 35/005; B23K 35/0238; B23K 35/0244; B23K 35/22; B23K 35/3006; B23K 35/3013; B23K 35/302; B23K 35/3033; B23K 35/3046; B23K 35/32; B23K 35/322; B23K 35/325
See application file for complete search history.

(56) References Cited

U.S. PATENT DOCUMENTS

| | | | | |
|---|---|---|---|---|
| 3,188,732 | A * | 6/1965 | Feduska ................. | B23K 35/30 228/262.1 |
| 3,466,737 | A * | 9/1969 | Hanink ................. | B23K 35/32 228/208 |
| 5,863,396 | A * | 1/1999 | Flanigan ............... | C23C 14/042 118/721 |
| 2009/0140073 | A1* | 6/2009 | Thomson ................ | F23D 11/36 239/128 |
| 2018/0187564 | A1 | 7/2018 | Cui et al. | |

* cited by examiner

*Primary Examiner* — Erin B Saad
(74) *Attorney, Agent, or Firm* — Crowell & Moring LLP

(57) ABSTRACT

A method of diffusion bonding utilizing vapor deposition comprises depositing a coating from a vapor comprising a temperature suppressant element onto a surface of a first component comprising a metal alloy, thereby forming a vapor deposited coating comprising the temperature suppressant element; assembling the first component with a second component comprising a mating surface to form an assembly, the vapor deposited coating contacting the mating surface; and exposing the assembly to a bonding temperature and a compressive force, thereby diffusion bonding the first component to the second component and forming a monolithic third component.

20 Claims, 6 Drawing Sheets

METHOD OF DIFFUSION BONDING UTILIZING VAPOR DEPOSITION

TECHNICAL FIELD

The present disclosure relates generally to diffusion bonding, and more particularly to a method of diffusion bonding that utilizes vapor deposition.

BACKGROUND

Gas turbine engines include a compressor, combustor and turbine in flow series along a common shaft. Compressed air from the compressor is mixed with fuel in the combustor to generate hot combustion gases that rotate the turbine blades and drive the compressor. The use of dual-walled components allows for higher operating temperatures in the engine by promoting more efficient cooling methodologies. Likewise, dual walled components can be utilized to reduce the weight of components while maintaining stiffness/strength of the component. Dual walled components have many applications. The multi-step method of manufacturing a dual-walled component may involve diffusion bonding, however, which can lead to a higher part cost compared to traditionally cast components. Diffusion bonding is a solid-state bonding method where elevated temperatures and typically high pressures are employed to obtain diffusion of atoms between mating components, allowing for formation of a thermally-stable metallurgical bond. Various gas turbine engine components may benefit from diffusion bonding. A partial list of these components includes compressor and turbine airfoils (e.g., coversheet and spar), compressor and turbine blisks, combustors, heat shields, structures, cases and others.

Diffusion bonding may be facilitated or improved by utilizing braze materials, such as braze foils or powders, between the components to be joined. For example, a braze material may be manually deposited on surface regions (e.g., pedestals) of a spar and partially diffused in a furnace. Then, a mating surface of a coversheet may be placed in contact with the braze material on the surface regions, and diffusion bonding may take place. This process may entail several furnace steps, long cleaning times to remove braze material from unwanted areas, and there may be multiple opportunities for contamination. Consequently, it would be advantageous to develop a better method of preparing a surface for diffusion bonding.

BRIEF DESCRIPTION OF THE DRAWINGS

The embodiments may be better understood with reference to the following drawing(s) and description. The components in the figures are not necessarily to scale. Moreover, in the figures, like-referenced numerals designate corresponding parts throughout the different views.

DETAILED DESCRIPTION

A new method of diffusion bonding that incorporates vapor deposition and avoids the long processing times and contamination possible with conventional methods is described in this disclosure.

Figure 1:
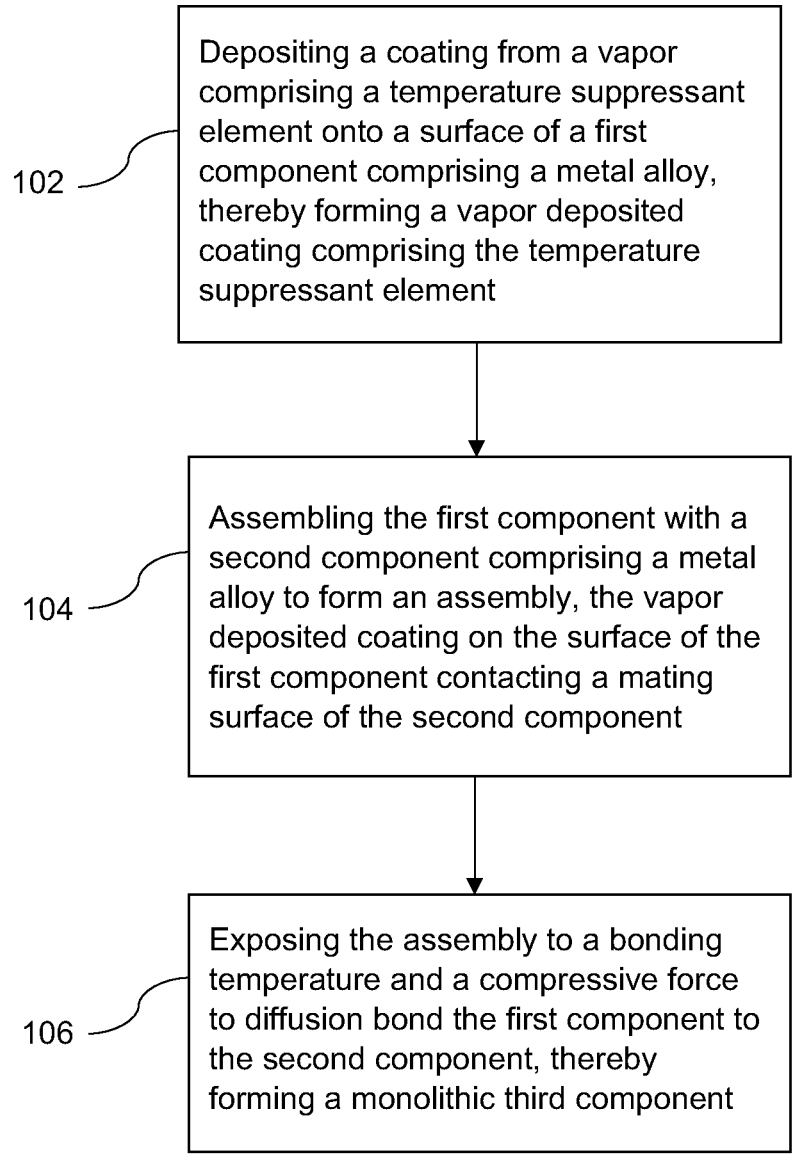
FIG. 1 is a flow chart of the method.

Referring to the flow chart of FIG. 1, the method includes depositing 102 a coating from a vapor comprising a temperature suppressant element onto a surface of a first component, thereby forming on the surface what may be referred to as a "vapor deposited coating" comprising the temperature suppressant element. The first component comprises a metal alloy and is intended to undergo diffusion bonding. The vapor deposition process may comprise physical vapor deposition or chemical vapor deposition, as described below. Typically, the temperature suppressant element comprises an element such as boron which is known to lower the melting point of a braze alloy and to rapidly diffuse into a metal component during bonding. The vapor deposition process may be applied to any type of surface, including discontinuous surfaces and damaged surfaces, in preparation for diffusion bonding. In such cases, a mask may be applied to the discontinuous or damaged surface prior to vapor deposition to facilitate selective deposition of the coating, as discussed below.

Referring again to FIG. 1, after vapor deposition 102, the first component is assembled with 104 a second component, which also comprises a metal alloy, to form an assembly where the vapor deposited coating on the surface of the first component contacts a mating surface of the second component. Typically, the metal alloy comprises a nickel-base alloy, a cobalt-base alloy, or an iron-base alloy. The assembly is exposed to 106 a bonding temperature and a compressive force, and the first component is diffusion bonded to the second component, thereby forming a monolithic third component comprising a bonded interface. The diffusion bonded, monolithic third component—which may be a new or a repaired component—can be utilized in a high temperature environment, such as in a gas turbine engine. In one example, as further described below, the first component comprises a spar, the second component comprises a coversheet, and the third component formed by diffusion bonding comprises an airfoil with dual-wall cooling. In another example, the first component includes a damaged surface, the second component comprises a repair coupon, and the third component formed by diffusion bonding is a repaired component that may be returned to service.

The temperature suppressant element may comprise boron (B), silicon (Si), and/or phosphorus (P), which are examples of common "eutectic formers" or "eutectic forming elements" that may lower the melting temperature of a braze alloy, such as a nickel-base braze alloy. These and other suitable eutectic forming elements for nickel-base and/or other braze alloys may be employed as the temperature suppressant element, and this disclosure is intended to cover all such elements. The vapor deposited coating may have an elemental composition comprising only the temperature suppressant element; in other words, the vapor deposited coating may consist essentially of the temperature suppressant element (e.g., B, Si or P). Alternatively, the vapor deposited coating may comprise a braze alloy that includes the temperature suppressant element, such as a nickel-boron alloy ("Ni—B alloy"). Accordingly, the vapor deposited coating may comprise, in some examples, B, Si, P, a Ni—B alloy, a Ni—Si alloy, a Ni—P alloy, a Ni—B—Si alloy, a Ni—B—P alloy, and/or a Ni—Si—P alloy. (In terms of nomenclature, it is understood that a Ni—B alloy includes at least nickel and boron and may include one or more other alloying elements, and a Ni—B—Si alloy includes at least nickel, boron and silicon and may include one or more other alloying elements, and so on.)

FIGS. 2A-2E are cross-sectional schematics that illustrate a vapor deposition method of depositing a coating onto a discontinuous surface in preparation for diffusion bonding, and FIGS. 3A-3D are cross-sectional schematics that illustrate a vapor deposition method of depositing a coating onto a damaged surface in preparation for diffusion bonding. FIGS. 2F, 2G, 3E and 3F illustrate post-deposition diffusion bonding of the discontinuous surface (FIGS. 2F and 2G) and the damaged surface (FIGS. 3E and 3F) to a mating surface, respectively.

Figure 2A:
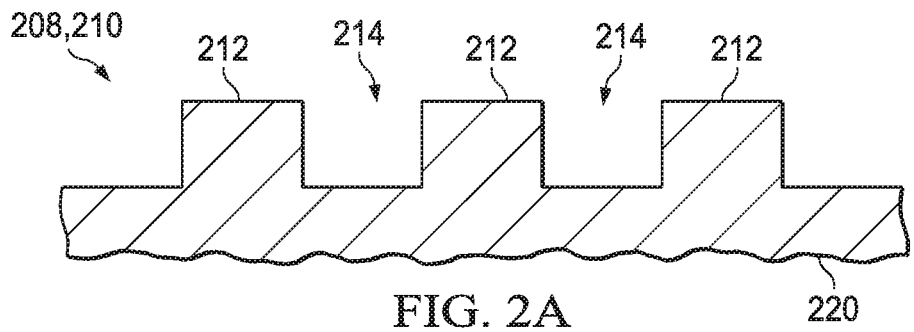
FIGS. 2A-2E are cross-sectional schematics that illustrate a vapor deposition method of depositing a coating onto a discontinuous surface in preparation for diffusion bonding.

Referring first to FIG. 2A, in this example the surface 208 to undergo diffusion bonding comprises a discontinuous surface 210 that includes surface regions 212 separated by gaps or holes 214. The surface regions 212 may be coplanar, as illustrated. The discontinuous surface 210 is part of a first component 220 that comprises a metal alloy, and the mating surface 224 (shown in FIG. 2F) is part of a second component 222 that comprises the same or a different metal alloy.

Figure 2B:
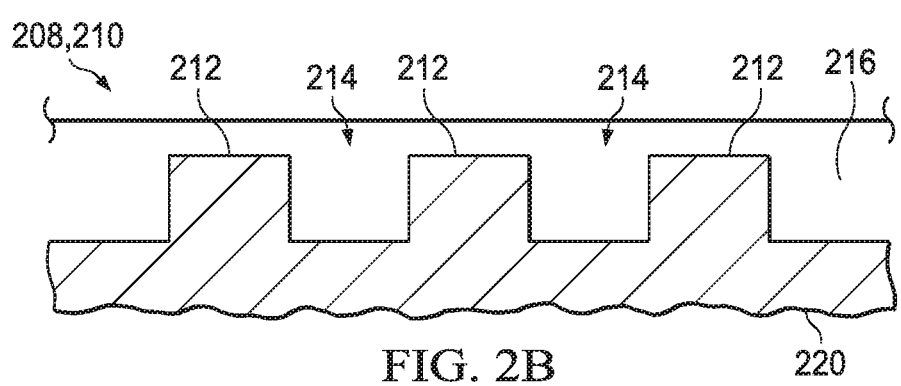
Figure 2C:
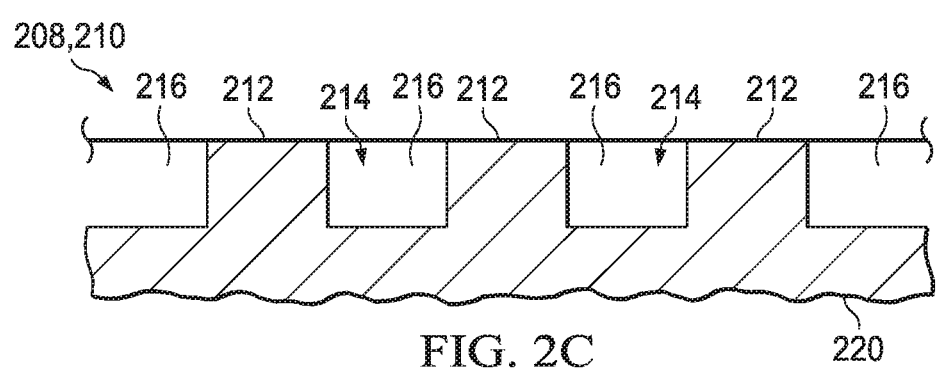

Referring now to FIG. 2B, a mask 216 may be applied to the surface 208 to facilitate selective deposition of the coating 218 (as discussed below in reference to FIGS. 2D and 2E) onto the surface regions 212. Typically, the mask 216 comprises a polymer (e.g., epoxy) or a ceramic and applying the mask comprises spreading or flowing a mask precursor over the discontinuous surface 210 and into the gaps 214. Accordingly, the mask precursor may comprise a flowable or spreadable material, such as an uncured polymer or a molten polymer, or a ceramic slurry or paste. Depending on the selection of the mask precursor, the application of the mask 216 to the surface 208 may include a drying, cooling, and/or curing step after spreading or flowing the mask precursor over the surface 208,210. The mask 216 is configured to fill or cover the gaps 214 and leave the surface regions 212 uncovered. Accordingly, the mask 216 may be applied only to the gaps 214 in the surface 210, or, after applying the mask 216 over an entirety of the surface 208,210 as shown in FIG. 2B, excess mask material may be removed from the surface 208,210 (e.g., by scraping or machining) leaving the surface regions 212 uncovered, as shown in FIG. 2C. Application of the mask 216 to the surface 208 is typically carried out in an ambient environment, such as open air at atmospheric pressure.

Figure 2D:
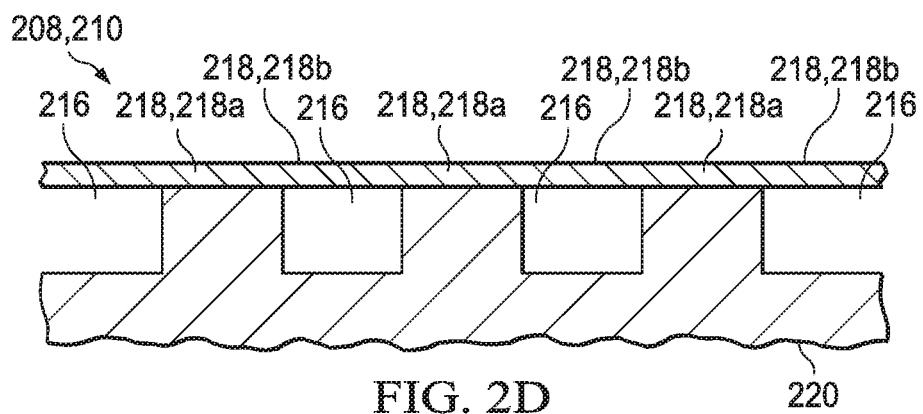

Next, as illustrated in FIG. 2D, a coating 218 is deposited onto the surface 208,210 from a vapor comprising a temperature suppressant element. A first portion 218a of the coating 218 is deposited onto the surface regions 212 and a second portion 218b of the coating 218 is deposited onto the mask 216. As described above, the coating 218 includes the temperature suppressant element. The vapor deposition method may comprise a physical vapor deposition process, such as thermal evaporation or sputtering, or a chemical vapor deposition process. Typically, physical or chemical vapor deposition of the coating takes place in a controlled environment in a closed process chamber. For example, vapor deposition may be carried out in a vacuum environment (e.g., a base pressure of $10^{-3}$ Pa or $10^{-4}$ Pa, or lower) or in a low-pressure inert or reactive gas atmosphere inside a vacuum chamber. In thermal evaporation, one or more source materials are heated to achieve a desired evaporation rate and the resulting vapor condenses on the surface to form the coating. The heating may comprise resistive heating or electron beam heating, for example. Elemental or alloy source materials may be employed, depending on the desired composition of the coating. In sputtering, atoms are ejected from one or more target materials ("sputtering targets") by impinging ions to form the vapor that ultimately condenses on the surface as the coating. In magnetron sputtering, as is known in the art, a closed magnetic field may be employed to trap electrons and enhance the sputtering rate. Elemental or alloy target materials may be employed, depending on the desired composition of the coating. In chemical vapor deposition, gaseous precursors react and/or decompose at elevated temperatures to form the vapor deposited coating of the desired composition. Various chemical vapor deposition (CVD) techniques are known in the art, such as plasma-enhanced chemical vapor deposition (PECVD), metal-organic chemical vapor deposition (MOCVD), and others. Typically, the vapor deposited coating has a thickness in a range from about 50 μm to about 200 μm, although lower (less than 50 μm) or higher thicknesses (greater than 200 μm) may also be suitable.

Figure 2E:
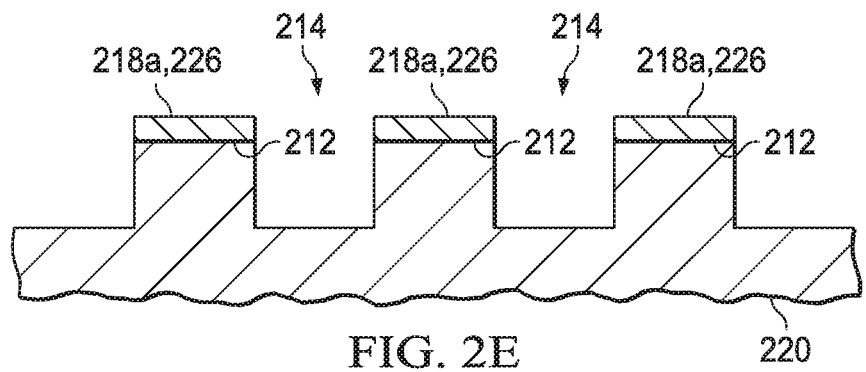

After deposition, the mask 216 is removed from the discontinuous surface 210 along with the second portion 218b of the coating 218, while the first portion 218a of the coating 218 remains on the surface regions 212, as shown in FIG. 2E, to form the vapor deposited coating 226. In one example, the mask 216 and the second portion 218b of the coating 218 may be removed by exposure to (e.g., submersion in) an aqueous or organic solvent capable of dissolving the mask 216. Ultrasonication may be employed to expedite dissolution. Alternatively, depending on the mask material, the mask 216 may be heated to a temperature suitable to liquefy or decompose the mask 216 without damaging the surface 208 or the first portion 218a of the coating 218. Mask removal may be carried out in a controlled environment as described above or in an ambient environment, such as open air at atmospheric pressure.

Figure 2F:
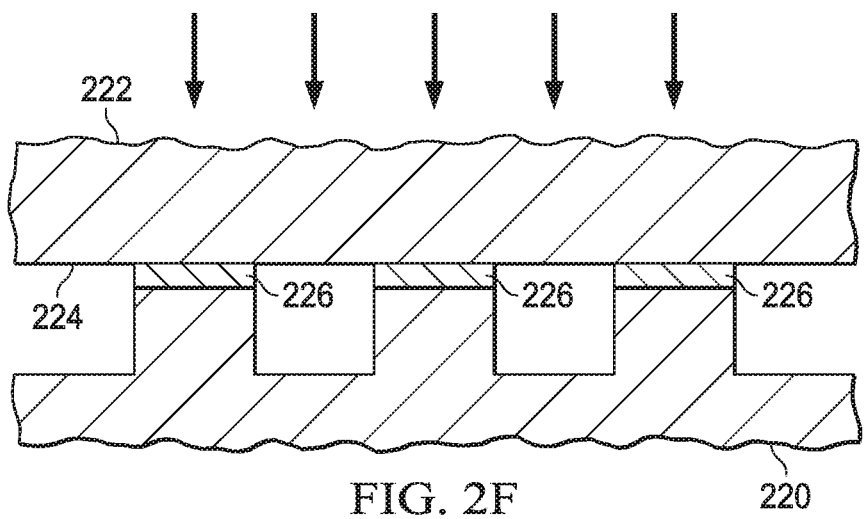
FIGS. 2F and 2G illustrate post-deposition diffusion bonding of the discontinuous surface to a mating surface.
Figure 2G:
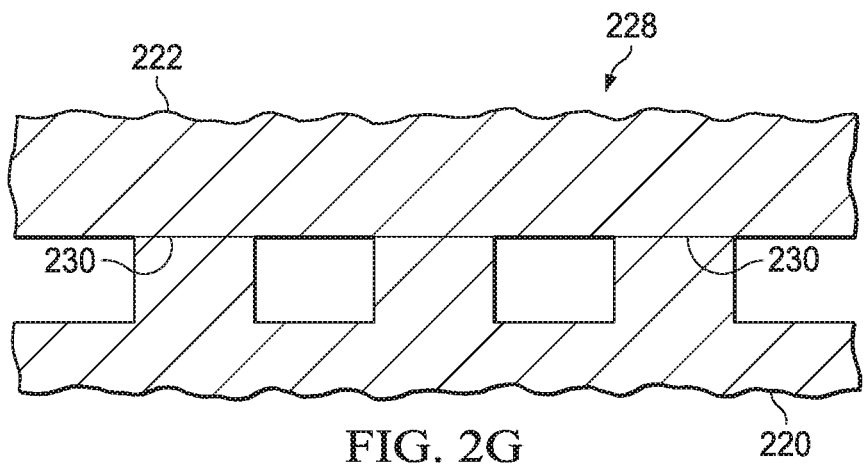

FIGS. 2F and 2G show assembly of the first component 220 with the second component 222, such that the vapor deposited coating 226 contacts the mating surface 224 of the second component 222, followed by diffusion bonding. The vapor deposited coating 226 is well-adhered and cannot be readily damaged during handling. Upon exposure to a high temperature and a compressive force, preferably in a controlled environment, such as a vacuum or an inert gas atmosphere, the first and second components 220,222 are bonded together. Diffusion bonding may be carried out using fixtures and methods known in the art. The temperature for diffusion bonding may depend upon the alloy and microstructure being bonded, but typically lies in a range from about 900° C. (1650° F.) to about 1275° C. (2325° F.). The method is applicable to nickel-base alloys, cobalt-base alloys, and iron-base alloys. Typically, the first component 220 and the second component 222 comprise the same metal alloy.

Once metallurgically bonded together, as illustrated in FIG. 2G, the first component 220 and the second component 222 form a monolithic third component 228 comprising a bonded interface 230 that may be substantially free of unwanted phases, defects, and/or porosity. The first and second components 220,222 may have a single-crystalline or polycrystalline (e.g., equiaxed) microstructure. When both the first and second components 220,222 have a single-crystalline microstructure, a directionally solidified microstructure may be obtained across the bonded interface 230. The first and second components 220 may comprise a metal alloy suitable for high temperature applications, and consequently the monolithic third component 228 may be utilized in a high temperature environment, such as in a gas turbine engine.

Figure 3A:
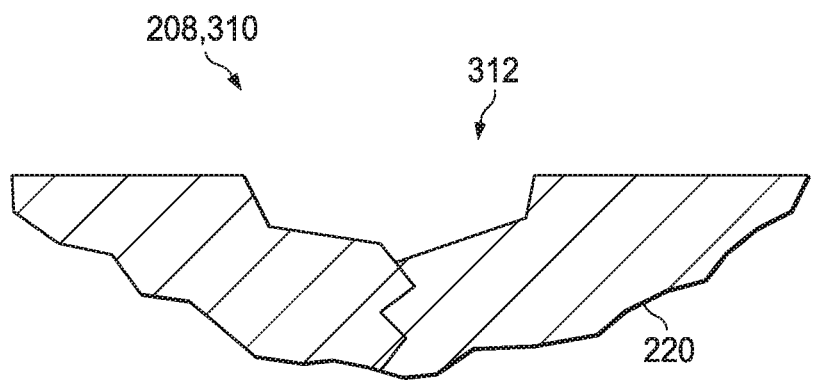
FIGS. 3A-3D are cross-sectional schematics that illustrate a vapor deposition method of depositing a coating onto a damaged surface in preparation for diffusion bonding.

Referring now to FIG. 3A, the surface 208 to be bonded may be a damaged surface 310 comprising a damaged region 312. The damaged surface 310 may be part of a first component 220 comprising a metal alloy, and the mating surface 224 (shown in FIG. 3E) may be part of a second component 222 that comprises the same or a different metal alloy.

Figure 3B:
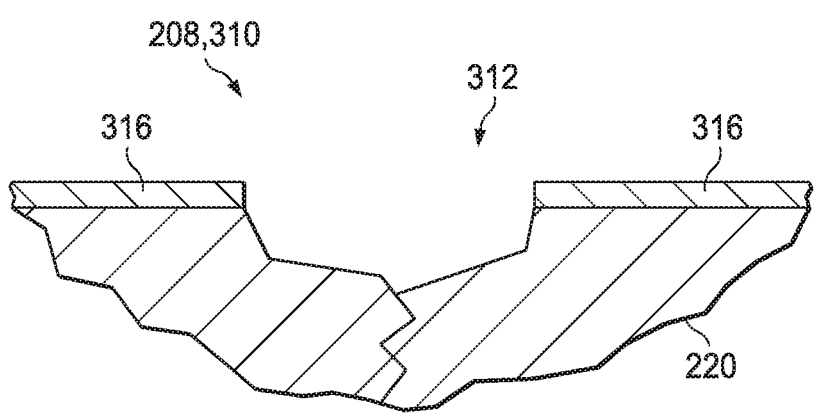

A mask 316 may be applied to the surface 208,310, as shown in FIG. 3B, to facilitate selective deposition of the coating 318 (discussed below in reference to FIGS. 3C and 3D) onto the damaged region 312. The mask 316 is configured to surround the damaged region 312 such that the damaged region 312 is uncovered for deposition. Typically, the mask 316 comprises a polymer or a ceramic and applying the mask comprises spreading a mask precursor over the damaged surface 310 without covering the damaged region 312. Accordingly, the mask precursor may comprise a spreadable material, such as uncured polymer or molten polymer, or a ceramic slurry or paste. In this example, the mask precursor preferably has a higher viscosity and is not readily flowable to avoid unintentionally covering the damaged region 312 on the damaged surface 310. Depending on the selection of the mask precursor, the application of the mask 316 to the surface 208 may include a drying, cooling, and/or curing step after spreading the mask precursor over the damaged surface 310. Application of the mask 316 to the surface 208,310 is typically carried out in an ambient environment, such as open air at atmospheric pressure.

Figure 3C:
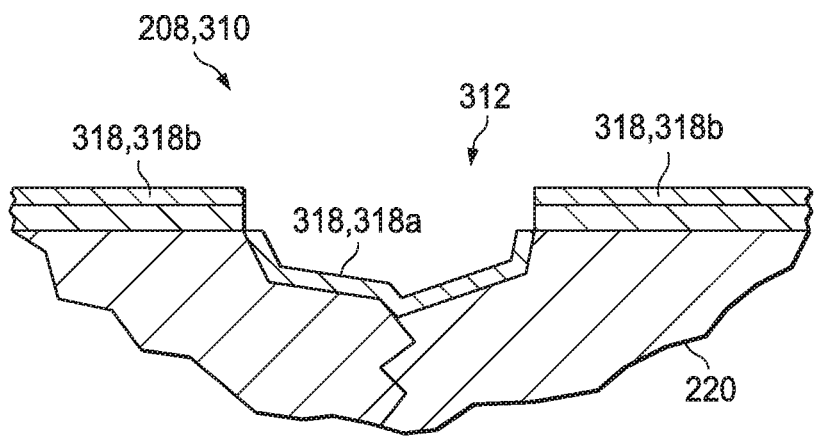

Next, as illustrated in FIG. 3C, a coating 318 is deposited onto the surface 208,310 from a vapor comprising a temperature suppressant element via a vapor deposition process. A first portion 318a of the coating 318 is deposited onto the damaged region 312 and a second portion 318b of the coating 318 is deposited onto the mask 316. As described above, the coating 318 includes the temperature suppressant element. The vapor deposition method may comprise a physical or chemical vapor deposition process as described above.

Figure 3D:
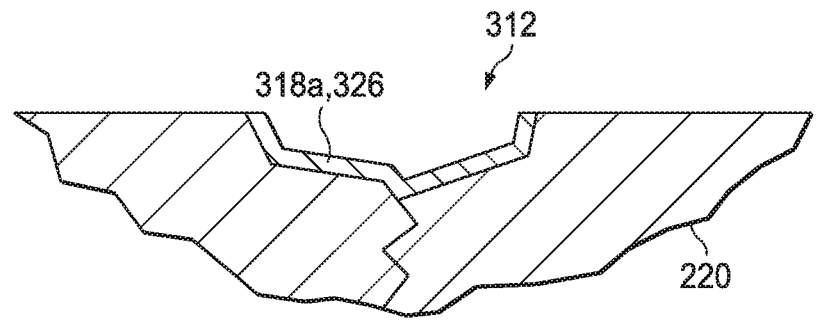

After deposition, the mask 316 is removed from the damaged surface 310 along with the second portion 318b of the coating 318, while the first portion 318a of the coating 318 remains on the damaged region 312, as shown in FIG. 3D, to form the vapor deposited coating 326. In one example, the mask 316 and the second portion 318b of the coating 318 may be removed by exposure to (e.g., submersion in) an aqueous or organic solvent capable of dissolving the mask 316. Ultrasonication may be employed to expedite dissolution. Alternatively, depending on the mask material, the mask 316 may be heated to a temperature suitable to liquefy or decompose the mask 316 without damaging the surface 208 or the first portion 318a of the coating 318. Mask removal may be carried out in a controlled environment as described above or in an ambient environment, such as open air at atmospheric pressure.

Figure 3E:
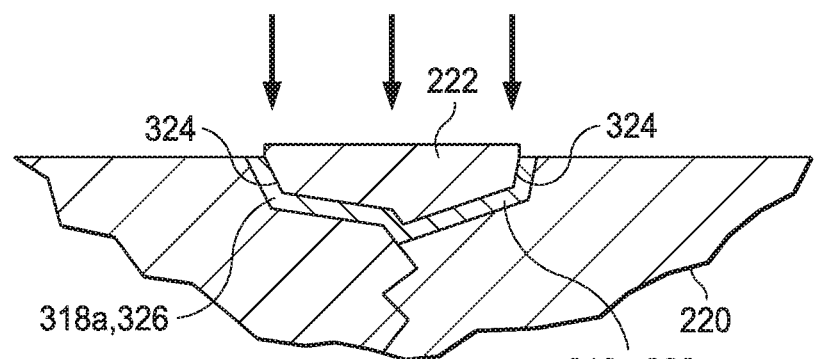
FIGS. 3E and 3F illustrate post-deposition diffusion bonding of the damaged surface to a mating surface.
Figure 3F:
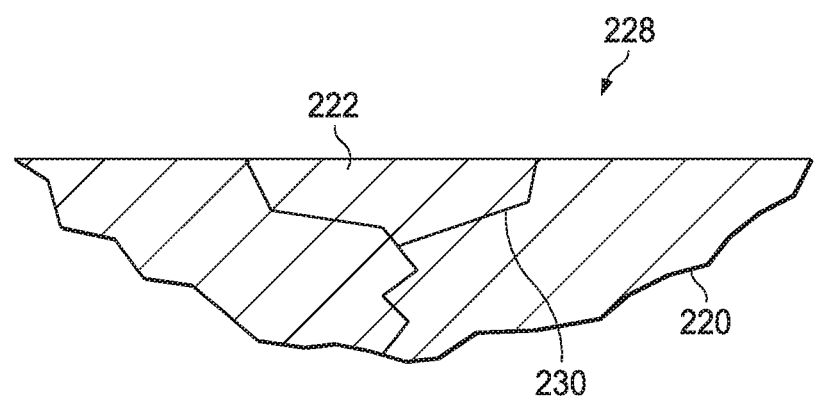

FIGS. 3E and 3F show assembly of the first component 220 with the second component 222, such that the vapor deposited coating 326 contacts the mating surface 324 of the second component 222, followed by diffusion bonding. The vapor deposited coating 226 is well-adhered and cannot be readily damaged during handling. In this example, the second component 222 may be a metal alloy piece sized for repair of the damaged region ("a repair coupon"). Upon exposure to a high temperature and a compressive force, preferably in a controlled environment, such as a vacuum or an inert gas atmosphere, the first and second components 220,222 are bonded together. Diffusion bonding may be carried out using fixtures and methods known in the art. The temperature for diffusion bonding may depend upon the alloy and microstructure being bonded, but typically lies in a range from about 900° C. (~1650° F.) to about 1275° C. (~2325° F.). The method is applicable to nickel-base alloys, cobalt-base alloys, and iron-base alloys. Typically, the first component 220 and the second component 222 comprise the same metal alloy.

In the process shown in FIGS. 3A-3E, the first component (which undergoes vapor deposition) comprises the damaged surface and the second component comprises the repair coupon. In an alternative approach, the first component may comprise the repair coupon, and the second component may comprise the damaged surface including the damaged region. In this situation, the vapor deposited coating is formed on a surface of the repair coupon, and the repair coupon is then assembled with the second component such that the vapor deposited coating contacts the damaged region, and diffusion bonding is carried out as described above. In this latter example, a mask may not be needed.

Once metallurgically bonded together, as illustrated in FIG. 3F, the first component 220 and the second component 222 form a monolithic third component 228 comprising a bonded interface 230 that may be substantially free of unwanted phases, defects, and/or porosity. In the examples described above, the monolithic third component 228 constitutes a repaired component. The first and second components 220 may comprise a metal alloy suitable for high temperature applications, and consequently the repaired component 228 may be returned to service in a high temperature environment.

Figure 4:
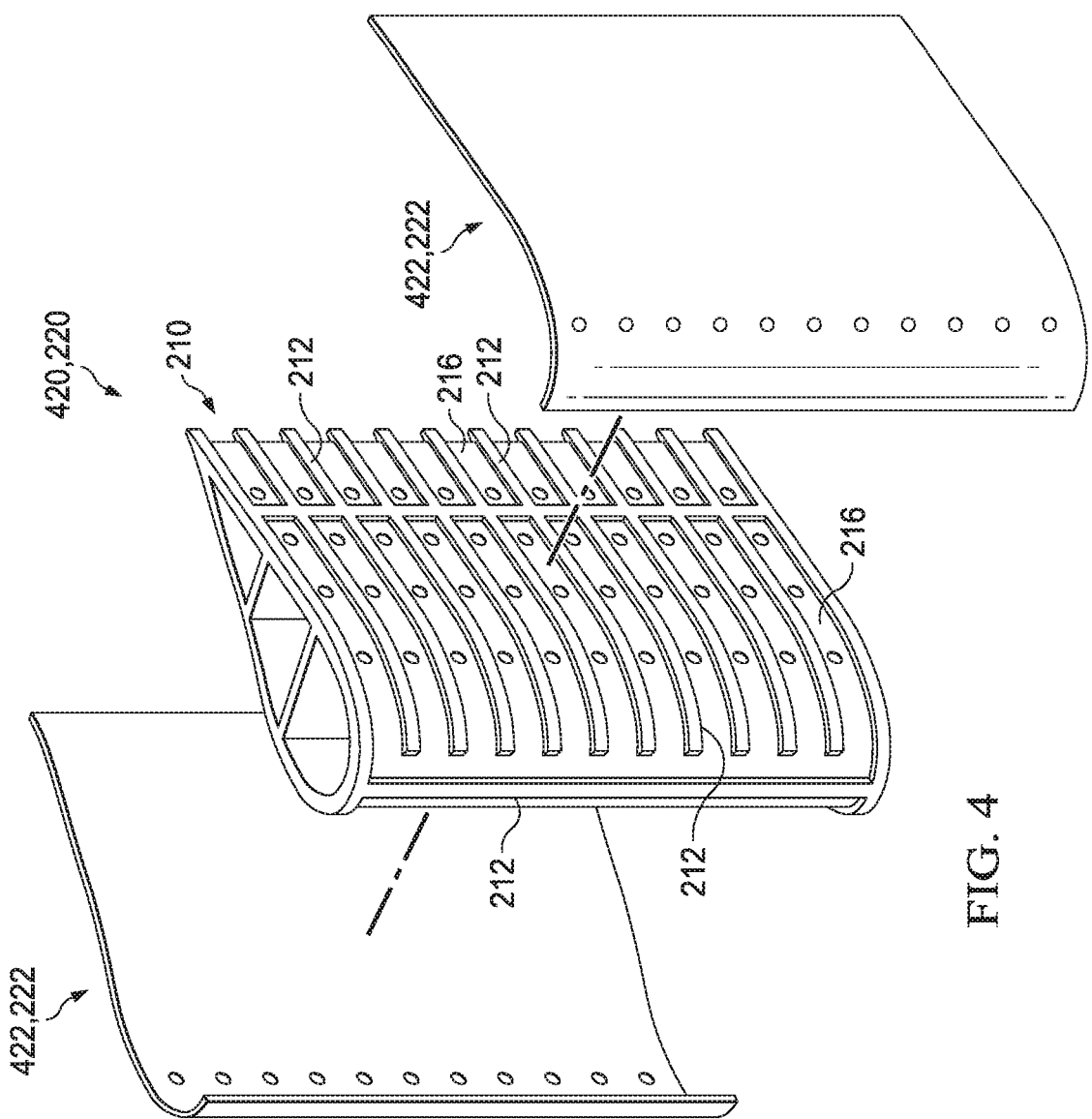
FIG. 4 shows an exemplary assembly for diffusion bonding comprising a spar and a cover sheet.

FIG. 4 shows an example where the first component 220 is a spar 420 and the second component 222 is a coversheet 422, which, when bonded together as described above in reference to FIGS. 2A-2G, may form part or all of an airfoil with dual-wall cooling for use in a gas turbine engine. More specifically, the spar 420 may include a discontinuous surface 210 that undergoes the surface preparation process described above such that the vapor deposited coating 226 is adhered to the surface regions 212. Referring to FIG. 4, the spar 420 may include raised surface features or "pedestals" having ends that constitute the surface regions 212 of the discontinuous surface 210, and flow channels between the pedestals that constitute the gaps 214 described above. The arrangement of the pedestals and flow channels shown in FIG. 4 is provided as an example only and is not intended to be limiting. Besides airfoils (e.g., turbine blades or vanes), the above-described method may be applicable to the fabrication and/or repair of combustion liners, heat shields, and/or other gas turbine engine components and/or other dual walled structures.

To clarify the use of and to hereby provide notice to the public, the phrases "at least one of <A>, <B>, . . . and <N>" or "at least one of <A>, <B>, <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

A first aspect relates to a method of diffusion bonding utilizing vapor deposition that comprises: depositing a coating from a vapor comprising a temperature suppressant element onto a surface of a first component comprising a metal alloy, thereby forming a vapor deposited coating comprising the temperature suppressant element; assembling the first component with a second component comprising a mating surface to form an assembly, the vapor deposited coating contacting the mating surface; and exposing the assembly to a bonding temperature and a compressive force to diffusion bond the first component to the second component and form a monolithic third component.

A second aspect relates to the method of the first aspect, wherein the metal alloy is selected from the group consisting of nickel-base alloy, cobalt-base alloy, and iron-base alloy.

A third aspect relates to the method of the first or second aspect, wherein the temperature suppressant element is selected from the group consisting of boron, silicon, and phosphorus.

A fourth aspect relates to the method of any preceding aspect, wherein the vapor deposited coating comprises a braze alloy including the temperature suppressant element.

A fifth aspect relates to the method of the fourth aspect, wherein the braze alloy is selected from the group consisting of Ni—B alloy, Ni—Si alloy, Ni—P alloy, Ni—B—Si alloy, Ni—B—P alloy, and Ni—Si—P alloy.

A sixth aspect relates to the method of any preceding aspect, wherein the vapor deposited coating has an elemental composition selected from the group consisting of boron, silicon and phosphorus.

A seventh aspect relates to the method of any preceding aspect, wherein depositing the coating from the vapor comprises physical vapor deposition or chemical vapor deposition.

An eighth aspect relates to the method of any preceding aspect, and further comprises, prior to depositing the coating, applying a mask to the surface to facilitate selective deposition of the coating.

A ninth aspect relates to the method of the eighth aspect, wherein the mask comprises a polymer or a ceramic.

A tenth aspect relates to the method of the eighth or ninth aspect, wherein the surface comprises a discontinuous surface including surface regions separated by gaps, wherein the mask is configured to fill the gaps and leave the surface regions uncovered, and wherein depositing the coating comprises depositing a first portion of the coating onto the surface regions and a second portion of the coating onto the mask.

An eleventh aspect relates to the method of the tenth aspect, wherein applying the mask to the surface comprising spreading or flowing a mask precursor over the discontinuous surface and into the gaps.

A twelfth aspect relates to the method of the tenth or eleventh aspect, and further comprises, after depositing the coating, removing the mask from the discontinuous surface along with the second portion of the coating, the first portion of the coating remaining on the surface regions and forming the vapor deposited coating.

A thirteenth aspect relates to the method of the ninth aspect, wherein the surface comprises a damaged surface including a damaged region, and wherein the mask is configured to surround the damaged region and leave the damaged region uncovered, and wherein depositing the coating comprises depositing a first portion of the coating onto the damaged region and depositing a second portion of the coating onto the mask.

A fourteenth aspect relates to the method of the thirteenth aspect, wherein applying the mask to the surface comprising spreading or flowing a mask precursor over the damaged surface without covering the damaged region.

A fifteenth aspect relates to the method of the thirteenth or fourteenth aspect, and further comprises, after depositing the coating, removing the mask along with the second portion of the coating, the first portion of the coating remaining on the damaged region and forming the vapor deposited coating.

A sixteenth aspect relates to the method of any one of the preceding aspects, wherein the first component comprises a damaged surface, and wherein the second component comprises a repair coupon.

A seventeenth aspect relates to the method of any one of the preceding aspects, wherein the first component comprises a repair coupon, and wherein the second component comprises a damaged surface.

An eighteenth aspect relates to the method of any one of the preceding aspects, wherein the first component comprises a spar and the second component comprises a coversheet.

A nineteenth aspect relates to the method of any one of the preceding aspects, wherein the monolithic third component comprises an airfoil, a combustion liner or a heat shield for a gas turbine engine.

A twentieth aspect relates to the method of any one of the preceding aspects, wherein the bonding temperature lies in a range from about 900° C. (1650° F.) to about 1275° C. (2325° F.).

In addition to the features mentioned in each of the independent aspects enumerated above, some examples may show, alone or in combination, the optional features mentioned in the dependent aspects and/or as disclosed in the description above and shown in the figures.

What is claimed is:

1. A method of diffusion bonding utilizing vapor deposition, the method comprising:
   applying a mask comprising a polymer or a ceramic to a surface of a first component comprising a metal alloy, the surface comprising a discontinuous surface including surface regions separated by gaps, the mask being configured to fill the gaps and leave the surface regions uncovered;
   depositing a coating from a vapor comprising a temperature suppressant element onto the surface, a first portion of the coating being deposited onto the surface regions and a second portion of the coating being deposited onto the mask,
   after depositing the coating, removing the mask from the discontinuous surface along with the second portion of the coating, the first portion of the coating remaining on the surface regions, thereby forming a vapor deposited coating comprising the temperature suppressant element;
   assembling the first component with a second component comprising a mating surface to form an assembly, the vapor deposited coating contacting the mating surface; and assembling the first component with a second component comprising a mating surface to form an assembly, the vapor deposited coating contacting the mating surface; and exposing the assembly to a bonding temperature and a compressive force, thereby diffusion bonding the first component to the second component and forming a monolithic third component.

2. The method of claim 1, wherein the metal alloy is selected from the group consisting of nickel-base alloy, cobalt-base alloy, and iron-base alloy.

3. The method of claim 1, wherein the temperature suppressant element is selected from the group consisting of boron, silicon, and phosphorus.

4. The method of claim 1, wherein the vapor deposited coating comprises a braze alloy including the temperature suppressant element.

5. The method of claim 4, wherein the braze alloy is selected from the group consisting of Ni—B alloy, Ni—Si alloy, Ni—P alloy, Ni—B—Si alloy, Ni—B—P alloy, and Ni—Si—P alloy.

6. The method of claim 1, wherein the vapor deposited coating has an elemental composition selected from the group consisting of boron, silicon and phosphorus.

7. The method of claim 1, wherein depositing the coating from the vapor comprises physical vapor deposition or chemical vapor deposition.

8. The method of claim 1, wherein applying the mask to the surface comprising spreading or flowing a mask precursor over the discontinuous surface and into the gaps.

9. A method of diffusion bonding utilizing vapor deposition, the method comprising:
applying a mask comprising a polymer or a ceramic to a surface of a first component comprising a metal alloy, the surface comprising a damaged surface including a damaged region, the mask being configured to surround the damaged region and leave the damaged region uncovered;
depositing a coating from a vapor comprising a temperature suppressant element onto the surface, a first portion of the coating being deposited onto the damaged region and a second portion of the coating being deposited onto the mask;
after depositing the coating, removing the mask along with the second portion of the coating, the first portion of the coating remaining on the damaged region, thereby forming a vapor deposited coating comprising the temperature suppressant element;
assembling the first component with a second component comprising a mating surface to form an assembly, the vapor deposited coating contacting the mating surface; and exposing the assembly to a bonding temperature and a compressive force, thereby diffusion bonding the first component to the second component and forming a monolithic third component.

10. The method of claim 9, wherein applying the mask to the surface comprising spreading or flowing a mask precursor over the damaged surface without covering the damaged region.

11. The method of claim 1, wherein the first component comprises a spar and the second component comprises a coversheet.

12. The method of claim 1, wherein the monolithic third component comprises an airfoil, a combustion liner or a heat shield for a gas turbine engine.

13. The method of claim 1, wherein the bonding temperature lies in a range from about 900° C. to about 1275° C.

14. The method of claim 9, wherein the bonding temperature lies in a range from about 900° C. to about 1275° C.

15. A method of diffusion bonding utilizing vapor deposition, the method comprising:
depositing a coating from a vapor consisting of a temperature suppressant element selected from the group consisting of boron, silicon and phosphorus onto a surface of a first component comprising a metal alloy, whereby the coating consists of the temperature suppressant element;
assembling the first component with a second component comprising a mating surface to form an assembly, the coating contacting the mating surface; and
exposing the assembly to a bonding temperature and a compressive force, thereby diffusion bonding the first component to the second component and forming a monolithic third component.

16. The method of claim 15, wherein the metal alloy is selected from the group consisting of nickel-base alloy, cobalt-base alloy, and iron-base alloy.

17. The method of claim 15, wherein the first component comprises a spar and the second component comprises a coversheet.

18. The method of claim 15, wherein the monolithic third component comprises an airfoil, a combustion liner or a heat shield for a gas turbine engine.

19. The method of claim 15, wherein the bonding temperature lies in a range from about 900° C. to about 1275° C.

20. The method of claim 15, wherein depositing the coating from the vapor comprises physical vapor deposition or chemical vapor deposition.

* * * * *